(12) United States Patent
Eaves et al.

(10) Patent No.: US 11,831,144 B2
(45) Date of Patent: Nov. 28, 2023

(54) DIGITAL POWER DISTRIBUTION SYSTEM WITH A NON-LINEAR LOAD

(71) Applicant: VoltServer, Inc., East Greenwich, RI (US)

(72) Inventors: Stephen Spencer Eaves, Charlestown, RI (US); Stanley Mlyniec, Coventry, RI (US)

(73) Assignee: VoltServer, Inc., East Greenwich, RI (US)

( * ) Notice: Subject to any disclaimer, the term of this patent is extended or adjusted under 35 U.S.C. 154(b) by 0 days.

(21) Appl. No.: 17/688,447

(22) Filed: Mar. 7, 2022

(65) Prior Publication Data

US 2022/0190587 A1  Jun. 16, 2022

Related U.S. Application Data

(63) Continuation of application No. 16/753,127, filed as application No. PCT/US2018/054527 on Oct. 5, 2018, now abandoned.

(60) Provisional application No. 62/572,495, filed on Oct. 15, 2017.

(51) Int. Cl.
*H02H 3/12* (2006.01)
*H02J 3/01* (2006.01)

(52) U.S. Cl.
CPC .............. *H02H 3/12* (2013.01); *H02J 3/01* (2013.01)

(58) Field of Classification Search
CPC ...................................... H02H 3/12; H02J 3/01
See application file for complete search history.

(56) References Cited

U.S. PATENT DOCUMENTS

| | | |
|---|---|---|
| 8,174,148 B2 | 5/2012 | Crucs |
| 2009/0204268 A1 | 8/2009 | Eaves |
| 2011/0291576 A1 | 12/2011 | Wong et al. |
| 2012/0075759 A1 | 3/2012 | Eaves |
| 2013/0103220 A1 | 4/2013 | Eaves |
| 2014/0070714 A1 | 3/2014 | Lee et al. |
| 2015/0207318 A1 | 7/2015 | Eaves |
| 2015/0215001 A1 | 11/2015 | Eaves |
| 2016/0134331 A1 | 5/2016 | Eaves |

(Continued)

FOREIGN PATENT DOCUMENTS

| | | |
|---|---|---|
| JP | 2012014833 A | 1/2012 |
| KR | 101440492 B1 | 9/2014 |
| WO | 2005/089309 A2 | 9/2005 |

*Primary Examiner* — Adi Amrany
(74) *Attorney, Agent, or Firm* — Modern Times Legal; Robert J. Sayre

(57) ABSTRACT

A digital power distribution system includes a source sensor configured to provide feedback that includes a signal indicative of voltage across the source terminals; a source controller configured to receive the feedback from the source sensor and to generate a control signal that opens a source disconnect switch between the power source and the source terminals; a non-linear load configured such that the electrical current it draws from the load terminals drops by at least an order of magnitude below a non-zero voltage threshold; reduced capacitance for storing charge and discharging that charge during the sample period, wherein the reduced capacitance is at a level for providing this low level of electrical current drawn by the non-linear load. The system can be configured without a disconnect switch between the load terminals and the non-linear load to thereby maintain the non-linear load in electrical contact with the load terminals.

12 Claims, 3 Drawing Sheets

(56) References Cited

U.S. PATENT DOCUMENTS

2017/0214236 A1    7/2017   Eaves
2017/0229886 A1    8/2017   Eaves
2018/0313886 A1   11/2018   Mlyniec et al.

DIGITAL POWER DISTRIBUTION SYSTEM WITH A NON-LINEAR LOAD

BACKGROUND

Digital electric power, or digital electricity, can be characterized as any power format where electrical power is distributed in discrete, controllable units of energy. Packet energy transfer (PET) is a new type of digital electric power protocol disclosed in U.S. Pat. Nos. 8,068,937, 8,781,637 (Eaves 2012) and U.S. Pat. No. 9,419,436 (Eaves Receiver Patent).

The primary discerning factor in a digital power transmission system compared to traditional, analog power systems is that the electrical energy is separated into discrete units; and individual units of energy can be associated with analog and/or digital information that can be used for the purposes of optimizing safety, efficiency, resiliency, control or routing. Because the energy in a PET system is transferred as discrete quantities, or quanta, it can be referred to as "digital power" or "digital electricity".

As described by Eaves 2012, a source controller and a load controller are connected by power transmission lines. The source controller of Eaves 2012 periodically isolates (disconnects) the power transmission lines from the power source and analyzes, at a minimum, the voltage characteristics present at the source controller terminals directly before and after the lines are isolated. The time period when the power lines are isolated was referred to by Eaves 2012 as the "sample period", and the time period when the source is connected is referred to as the "transfer period". The rate of rise and decay of the voltage on the lines before, during and after the sample period reveal if a fault condition is present on the power transmission lines. Measurable faults include, but are not limited to, short circuit, high line resistance or the presence of an individual who has improperly come in contact with the lines.

U.S. Pub. Pat Application No. 2016/0134331 (Eaves Power Elements) describes the packaging of the source side components of Eaves 2012, in various configurations, into a device referred to as a digital power transmitter.

U.S. Pat. No. 9,419,436 (Eaves Receiver Patent) describes the packaging of various configurations of the load side components of Eaves 2012 into a device referred to as a digital power receiver. The receiver converts the digital electricity format back to traditional analog DC format.

U.S. Pub. Pat Application No. 2017/0214236 A1 describes methods and apparatus for placing multiple digital power receivers with parallel attachment to a single transmission line, thus reducing the amount of transmitter hardware allocated to each receiver.

SUMMARY

Methods and apparatus for configuring a digital electricity system for powering a non-linear load, such as LED lighting, are described herein, where various embodiments of the methods and apparatus for performing the method may include some or all of the elements, features and steps described below.

A digital power distribution system includes a source sensor configured to provide feedback that includes a signal indicative of voltage across the source terminals; a source controller configured to receive the feedback from the source sensor and to generate a control signal that substantially increases or decreases impedance between the power source and the source terminals; a non-linear load configured such that the electrical current it draws from the load terminals drops by at least an order of magnitude below a non-zero voltage threshold; reduced capacitance (i.e., a capacitance that is less than the capacitance that would be needed for a load that is linear but that would still draw the same electrical current from the load terminals as the non-linear load while a source disconnect device is closed) on the load side for storing charge and discharging that charge during the sample period, wherein the stored charge of the reduced capacitance is limited to a reduced level for providing the at-least-an-order-of-magnitude-lower electrical current drawn by the non-linear load below the voltage threshold; and a source disconnect device responsive to the control signal from the source controller. The source controller is configured to periodically interrupt the supply of power to the non-linear load by opening the source disconnect device during the sample period, allowing at least the source terminal voltage to be measured during the interruption. A logic device is implemented in at least the source controller and configured to open the source disconnect device and to perform at least one source-terminal voltage measurement when the source disconnect device is opened. The source-terminal voltage measurement is representative of impedance between the source terminals and a corresponding discharge rate of capacitance between the source terminals and to determine if the source-terminal voltage measurement falls outside of predetermined high and low limits. The source-terminal voltage measurement being outside of the predetermined high and low limits indicates that there is a foreign object or individual making contact with the source or load terminals or with the transmission line or that there is a failure in the digital power distribution system. The logic device generates a signal to close the source disconnect device if the voltage measurement falls within the predetermined high and low limits.

Embodiments of methods and apparatus described herein build on the earlier work of Eaves 2012 and the Eaves Receiver Patent by focusing on a novel digital electricity configuration for light emitting diodes (LEDs) or other loads (such as diodes, e.g., for space heating or solar cells) that have diode-like characteristics. A diode is a nonlinear load with a current draw that is nonlinearly proportional to the voltage applied to it. Diodes have a threshold voltage at which point they transition from drawing essentially no electrical current to drawing substantial current from the source. In the case where a digital electricity system is powering a non-linear load, simplified, lower cost receivers can be employed. Also described herein are methods and apparatus for exploiting the particular characteristics of non-linear loads.

In executing the packet energy transfer (PET) protocol inherent to digital electricity, a portion of the total energy packet period is allocated for the transfer of energy from the source to the load. This portion of the packet period is referred to as the transfer period. The remaining time in the packet period is allocated for detecting faults and transferring data. This portion of the packet period is referred to as the sample period. In one embodiment, the controller on the source side of the system monitors the decay in transmission line voltage during the sample period. A change in the rate of decay can indicate a variety of fault conditions, including a short circuit or human contact with the transmission line conductors.

On the load side of the system, a device referred to as a receiver converts the digital power format back to traditional analog DC format. A receiver typically contains a load side disconnect switch that allows electrical current to flow only in the direction of powering from the source to the load. In its most simple form, a load disconnect switch is a diode. The electrical current flows through the disconnect switch into a DC link section of the receiver. In prior forms of receivers, the DC link typically includes a capacitor to store energy during the sample period of the energy packet period when current is interrupted to the receiver. Without the energy storage provided by the link capacitor, the DC link voltage would drop to zero during the sample period when any appreciable load is drawn from the receiver. This drop would, in turn, interrupt power to the load in each sample period, which is, in most cases, an unacceptable condition for most load devices. Moreover, each time a new packet period begins, the digital power transmitter would need to restart the load device. Because many load devices draw a start-up current that is much higher than their steady state current, the constant restarting of the load would cause spikes in current from the transmitter that could result in the transmitter interrupting the line due to a short circuit fault.

In the case where the load disconnect switch is a simple diode and there is no DC link capacitor, the drop in voltage across the DC link during the sample period would also result in a loss of voltage in the digital power transmission lines that extend from the transmitter to the receiver. This voltage loss occurs because the transmission line voltage cannot be significantly higher than the DC link with the specified diode configuration. The transmission-line voltage drop would be perceived as a fault condition by the transmitter because the transmitter algorithm would interpret the voltage drop as a fault caused by a line-to-line short circuit or human contact with the transmission lines.

An LED light string (or other diode-like load) is a unique application because periodic interruptions can be acceptable where the string can be operated in pulse-width-modulated (PWM) mode. In this mode, the ratio of "on" time versus "off" time over a predetermined time period can be modulated to adjust the intensity of light being emanated. If the time period is short enough and repeated at a sufficiently high frequency, the on/off transitions become undiscernible to the human eye, and are seen as simply a lower or higher light intensity.

This property affords the opportunity to remove the DC link capacitor from the receiver and additionally allows the load disconnect switch, or diode, to be removed from the receiver circuitry. As will be shown in more detail, diodes exhibit non-linear load characteristics. In the case of a series-connected string of LEDs, the nonlinear load relationship means that there is a predetermined voltage threshold where electrical current begins to flow into an LED array as the input voltage rises. When the voltage applied to the LED string is lower than this threshold, only minute amounts of electrical current will flow into or out from the LED string (e.g., less than $1/10^{th}$ the electrical current flowing through the LED string above the threshold). The characteristics can be incorporated into the transmitter fault detection algorithm providing the novel benefit of being able to detect if there is a damaged or incompatible LED string attached to the digital electricity system. Overall a safer, more reliable and lower cost digital power system can be constructed when using the described application-specific design for LED lighting.

DETAILED DESCRIPTION

The foregoing and other features and advantages of various aspects of the invention(s) will be apparent from the following, more-particular description of various concepts and specific embodiments within the broader bounds of the invention(s). Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein.

The terminology used herein is for the purpose of describing particular embodiments and is not intended to be limiting of exemplary embodiments. As used herein, singular forms, such as "a" and "an," are intended to include the plural forms as well, unless the context indicates otherwise. Additionally, the terms, "includes," "including," "comprises" and "comprising," specify the presence of the stated elements or steps but do not preclude the presence or addition of one or more other elements or steps.

Digital electric power, or digital electricity, can be characterized as any power format where electrical power is distributed in discrete, controllable units of energy. A digital electricity system periodically isolates an electrical transmission line from both the transmitter and receiver elements to analyze analog line characteristics that reflect a possible fault or human contact with the transmission wiring.

Power distribution system safety protection devices can include power distribution systems with electronic monitoring to detect and disconnect power in the event of an electrical fault or safety hazard, particularly where an individual has come in contact with exposed conductors. More specifically, the power distribution system can be used for LED lighting.

Figure 1:
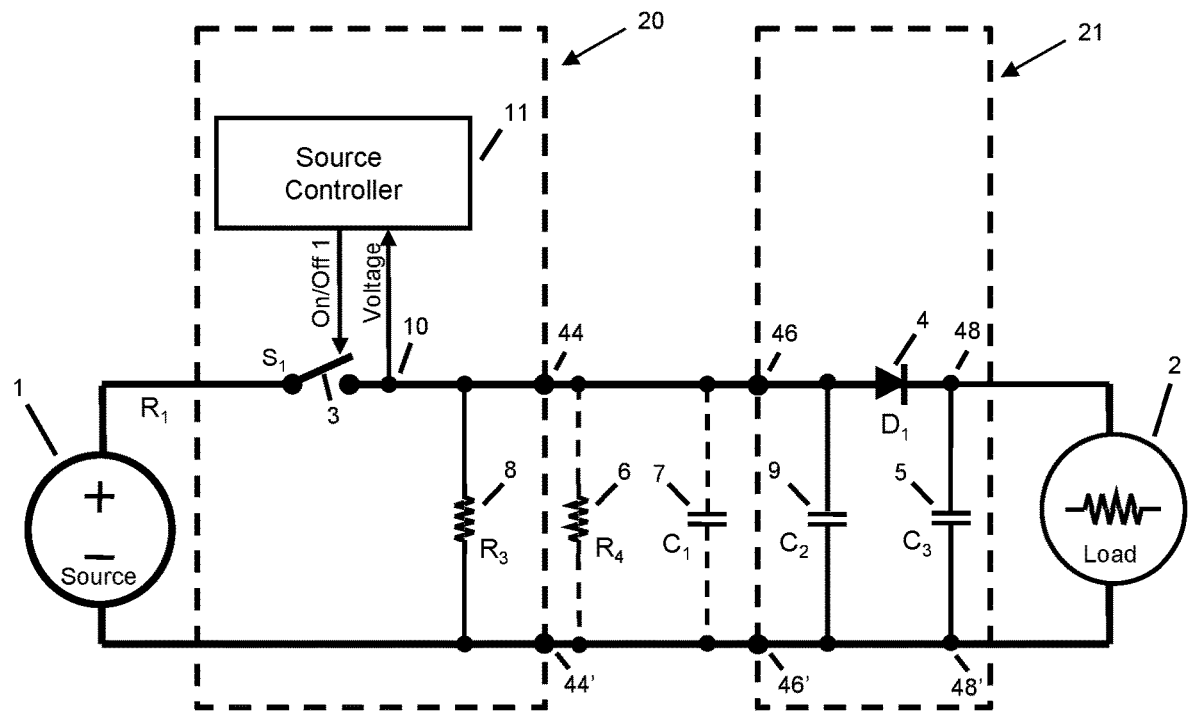
FIG. 1 is a block diagram of an embodiment of a safe power distribution system.

A representative digital power system, as originally described in Eaves 2012, is shown in FIG. 1. The system comprises a source 1 with source terminals 44, 44' and at least one load 2. A receiver 21 including source-side terminals 46, 46' and load-side terminals 48, 48' is connected to the transmission line between the source 1 and the load 2, wherein the source-side terminals 46, 46' and the load-side terminals 48, 48' of the receiver 21 provide electrical coupling between the source 1 and the load 2. The PET protocol is initiated by operating switch means ($S_1$) 3 to periodically disconnect the source from the power transmission lines. When the switch is in an open (non-conducting) state, the lines are also isolated from any stored energy that may reside at the load by the blocking action of isolation diode ($D_1$) 4.

Eaves 2012 offered several versions of alternative switches that could replace $D_1$, but all versions would have similar results related to the present invention. Capacitor ($C_3$) 5 is representative of an energy storage element on the load side of the circuit.

The transmission lines have inherent line-to-line resistance ($R_4$) 6 and capacitance ($C_1$) 7. The PET system architecture, as described by Eaves 2012, adds additional line to line resistance ($R_3$) 8 and capacitance ($C_2$) 9. At the instant when the switch ($S_1$) 3 is opened, capacitors ($C_1$) 7 and ($C_2$) 9 have stored charge that decays at a rate that is inversely proportional to the additive values of resistors ($R_4$) 6 and ($R_3$) 8. Capacitor ($C_3$) 5 does not discharge through resistors ($R_3$) 8 and ($R_4$) 6 due to the reverse blocking action of the diode ($D_1$) 4. The amount of charge contained in capacitors ($C_1$) 7 and ($C_2$) 9 is proportional to the voltage across them, and can be measured at point 10 by the source controller 11.

Figure 2:
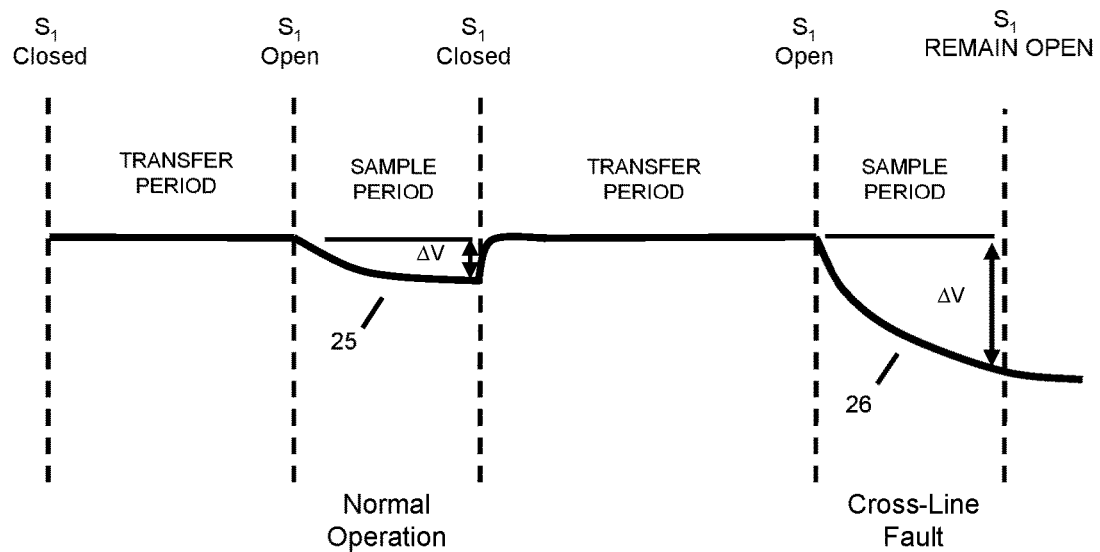
FIG. 2 is a more detailed block diagram of an embodiment of a source controller.

As described in Eaves 2012, a change in the rate of decay of the energy stored in capacitors ($C_1$) 7 and ($C_2$) 9 can indicate the existence of a cross-line fault on the transmission lines. The difference between normal operation and a fault, as presented by Eaves 2012, is illustrated in FIG. 2.

Referring again to FIG. 1, the combination of the switch ($S_1$) 3, the source controller 11, and the resistor ($R_3$) 8 can be referred to as a transmitter 20. The combination of the diode ($D_1$) 4, capacitor ($C_2$) 9, and capacitor ($C_3$) 5 can be referred to as a receiver 21.

The transmission lines have inherent line-to-line resistance ($R_4$) 6 and capacitance ($C_1$) 7. The PET system architecture, as described by Eaves 2012, adds additional line-to-line resistance ($R_3$) 8 and capacitance ($C_2$) 9. At the instant when the switch ($S_1$) 3 is opened, capacitors ($C_1$) 7 and ($C_2$) 9 have stored charge that decays at a rate that is inversely proportional to the additive values of resistances ($R_4$) 6 and ($R_3$) 8. Capacitor ($C_3$) 5 does not discharge through resistors ($R_3$) 8 and ($R_4$) 6 due to the reverse blocking action of the isolating diode ($D_1$) 4. The amount of charge contained in capacitors ($C_1$) 7 and ($C_2$) 9 is proportional to the voltage across them and can be measured at point 10 by a source controller 11.

As described in Eaves 2012, a change in the rate of decay of the energy stored in capacitors ($C_1$) 7 and ($C_2$) 9 can indicate that there is a cross-line fault on the transmission lines. The difference in voltage decay between normal operation 25 and the voltage decay during a cross-line fault 26 is illustrated in FIG. 2.

A differentiating factor in the methods described herein for operating a digital power system with an LED string is found in exploiting the non-linear load characteristics of LEDs to implement a simplified receiver design utilizing a small or negligible capacitance value (i.e., a reduced capacitance) for capacitor ($C_3$) 5 of FIG. 1, thus allowing the benefits of pulse-width-modulation (PWM) dimming from the transmitter and the elimination of the cost and reliability concerns of capacitor ($C_3$) 5. The capacitance thereby delivered to the load is thereby reduced from (i.e., lower than) the capacitance that would be needed for a load that is linear but that would still draw the same electrical current from the load terminals as the non-linear load when a source disconnect device is closed. In one embodiment, the LEDs can serve in place of load disconnect ($D_1$) 4, further simplifying the receiver to only require capacitor ($C_2$) 9. An algorithm executed by the source controller 11 detects the faster decay of the transmission-line voltage below the threshold voltage that is due to a line-to-line fault and interrupts power by opening the switch ($S_1$) 3.

Figure 3:
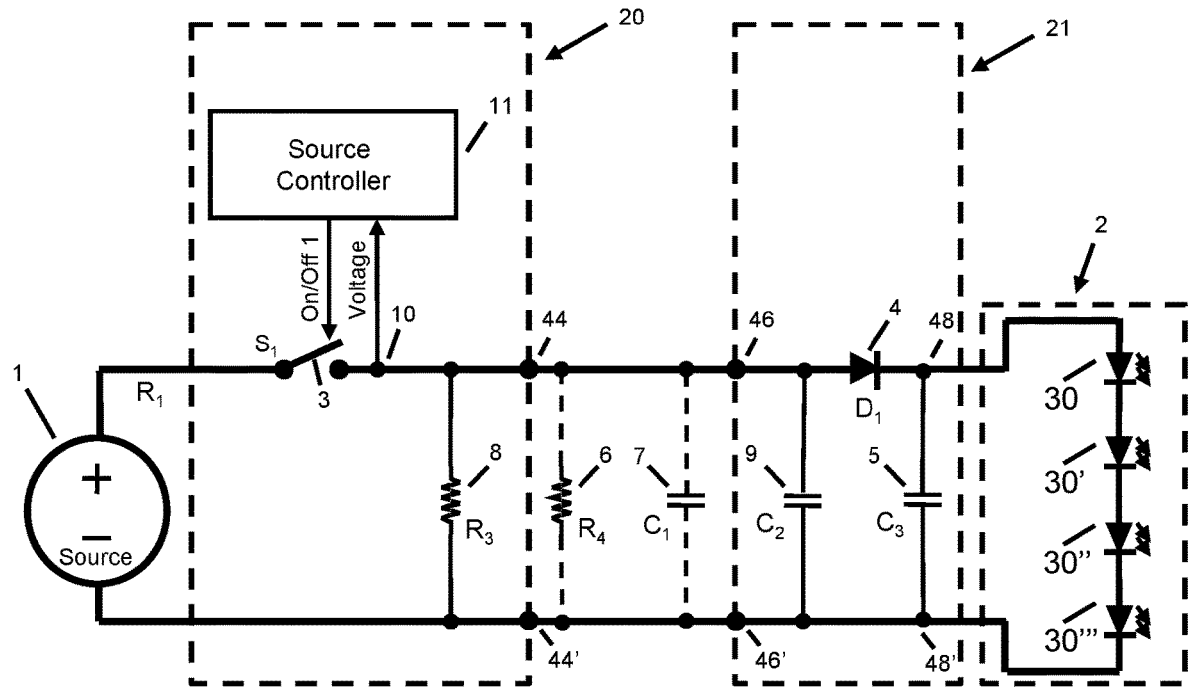
FIG. 3 is a diagram of a power distribution system where the load is a series connected LED string.
Figure 4:
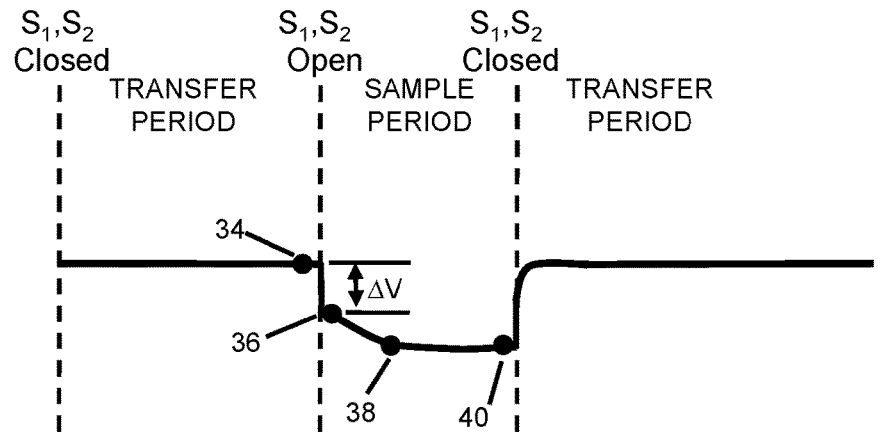
FIG. 4 is a diagram of transmission-line voltage characteristics when powering an LED string.

In FIG. 3, the load 2 comprises a series string of LEDs 30, 30', 30", 30''', 30'''', as would be typical for an LED light. If the capacitance of capacitor ($C_3$) 5 is small in comparison to the energy drawn by the LED string during the sample period, the voltage across capacitor ($C_3$) 5 will drop quickly and will keep diode ($D_1$) 4 forward biased. This voltage drop across capacitor ($C_3$) 5 will, in turn, cause the voltage across the transmission lines to drop quickly, as illustrated in FIG. 4. The voltage drop is illustrated as the difference between the voltage at point 34 just before the switch ($S_1$) 3 is opened and the voltage at point 36 just after the switch ($S_1$) 3 opened. The sharp initial decrease, evidenced in the high rate of decay from point 34 to point 36 is a voltage drop proportional to the series resistance of the transmission lines multiplied by the electrical current, also referred to as the transmission-line IR drop. The next transition is from points 36 to 38. This transition is a moderate decay in voltage that is due to the drain of the capacitors ($C_2$) 9 and ($C_3$) 5 of FIG. 3 as the LED string continues to draw power after the opening of disconnect switch ($S_1$) 3. Referring to FIG. 4, the slowest rate of voltage decay occurs between points 38 and 40. During this period, the voltage has decayed below the turn-on threshold voltage of the LED string; and the LEDs are drawing little or no power. At this point, diode ($D_1$) 4 will become reverse biased, halting the discharge of capacitor ($C_3$) 5; and the transmission line voltage decay will be due to the discharge of the capacitors ($C_1$) 7 and ($C_2$) 9 through resistors ($R_3$) 8 and ($R_4$) 6. If there is a cross-line fault on the transmission lines, the decay rate will increase as was previously described and illustrated in FIG. 2.

There are specific advantages in using a capacitor ($C_3$) 5 with a sufficiently low capacitance value such that it can produce a decaying voltage on the transmission line over the sample period characterized by stages of the types illustrated in the exemplification FIG. 4. When capacitor ($C_3$) 5 is large, it presents a significant expense and volume in the receiver. In LED lighting applications, the LEDs produce heat that can be coupled to the capacitor. This heat transfer decreases the life of the capacitor. Capacitors used in LED power supplies have historically been a major point of failure. Another advantage of making capacitor ($C_3$) 5 small is that it allows for the ratio between the transfer time and sample time in the energy packet to be varied for dimming, or it allows for varying the intensity of the LED light.

Varying the ratio of on-time to off-time is commonly known to the industry as pulse width modulation (PWM). For PWM dimming to be possible, the voltage on capacitor ($C_3$) 5 must decay rapidly during each sample period to reduce the electrical current flowing into the LED string.

Attempting to implement PWM at low on-time ratios with a large $C_3$ capacitance would result in very high peak currents every time capacitor ($C_3$) 5 needs to be recharged at the beginning of the on-time portion of the PWM cycle. This property again leads to an advantage of implementing small, or even negligible, capacitance values to capacitor ($C_3$) 5 when it is desirable to allow PWM dimming of the LED string.

Figure 5:
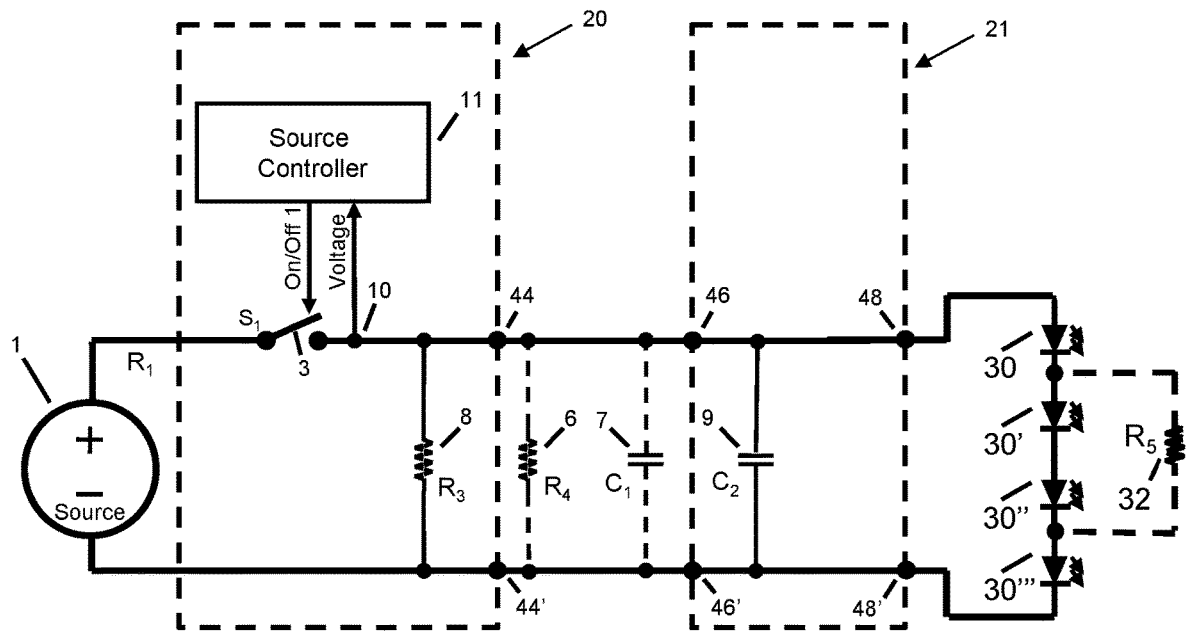
FIG. 5 is a diagram of a power distribution system where the LED string enables a simplified load circuit.

In earlier representations of digital power receivers, such as in Eaves 2012 and the Eaves Receiver Patent, the diode ($D_1$) 4 of FIG. 3 was an embodiment of the load disconnect device and was described as part of the load side of a digital power system. However, in instances where PWM dimming is to be implemented, capacitor ($C_3$) 5 of FIG. 3 can be removed; and the LEDs, which are diode devices, can serve as the load disconnect device. This configuration is depicted in FIG. 5, where one or more of LEDs 30, 30', 30", 30''' serve in place of diode ($D_1$) 4 of receiver 21 of FIG. 3. With the absence of capacitor ($C_3$) 5, the receiver 21 of FIG. 5 is reduced to only capacitor ($C_2$) 9. It is the non-linear load characteristics of the LED string that make packet energy transfer possible after removing capacitor ($C_3$) 5 because the LEDs do not continue to draw power through the entire sample period of the energy packet. As described earlier, referring to FIG. 4, between points 38 and 40, the transmission line voltage has decayed below the turn-on threshold voltage of the LED string, and the LEDs are drawing little or no power. If the LED string had a linear load characteristic, thereby having no minimum turn-on threshold (as does a resistor, for example), the transmission line would quickly decay to zero, making it impossible to detect the voltage decay indicative of a transmission line fault, and thereby making it impossible to implement packet energy transfer.

The source controller 11 of FIG. 5 can execute a control algorithm to vary the PWM duty cycle to maintain an average operating current to the LEDs that optimize required intensity, efficiency and service life. The PWM is implemented by the source controller 11 varying the "on time" versus "off time" of source disconnect switch ($S_1$) 3. It is notable that the LED threshold voltage is inversely proportional to the LED temperature and can be used by the transmitter controller to determine optimal operating conditions and to adjust the duty cycle to vary average LED string current, as is widely known by those skilled in the art of LED lighting design.

One area of difficulty with implementing packet energy transfer without capacitor ($C_3$) 5 or with a very small capacitance value for capacitor ($C_3$) 5 is that it becomes difficult to detect the difference between the transmission line IR drop made apparent in FIG. 4 in the transition between points 34 and 36 and to detect the voltage decay of the transmission lines due to the power draw of the LED string before it reaches the minimum threshold voltage of the string, as depicted in FIG. 4 between points 36 and 38. As was described in Eaves 2012, detecting the IR drop in the transmission lines is an important part of detecting in-line faults. An example of an in-line fault is a poor connection or damaged cable that greatly increases the resistance of the transmission line, which would cause a significant amount of fault energy to be dissipated in the area of the anomaly, thereby overheating the cable and possibly causing a fire. In methods of this disclosure where the IR drop is undetectable, a second method of in-line fault detection assigns a high and low power limit to the LED string. A higher-than-normal power draw by the string would be due to excessive energy being dissipated outside the LED string, indicating a fault condition. Too low of a power draw would also be attributed to a poor connection, damaged LED string or incompatible LED string.

Referring to FIG. 5, a third method for detecting an in-line fault calculates the difference between a predetermined LED threshold voltage and the voltage potential of the source 1. The predetermined threshold voltage is verified by source controller 11 during each energy packet by measuring the transmission line voltage between points 38 and 40 illustrated, as illustrated in FIG. 4. A maximum current can then be calculated based on the equation [$I_{max}=P_{max}/dV$], where $I_{max}$ is the maximum electrical current that is allowed to guarantee a maximum composite in-line power dissipation of $P_{max}$. dV is the difference in voltage between the voltage potential of source 1 and the threshold voltage, as measured by the source controller 11. The maximum power limit is referred to as a composite limit because dV includes a component of series line voltage drop due to the LED power consumption. When the LED string is powered, dV will include the following three components: a) any series voltage drop in the transmission lines due to the normal LED load current, b) the rise in the LED string voltage above their turn-on threshold due to powering the LEDs, and c) any additional series voltage drop due to an abnormal resistance in the transmission lines due to a fault. Although not an absolute measurement of the voltage drop due to an in-line fault, the method guarantees that the in-line power dissipated in the transmission lines outside the LED string is below $P_{max}$. For maximum power delivery to the LED string, it is advantageous to have an LED threshold voltage that is as close as practical in value to that of the source 1, as shown in FIG. 5, making dV a smaller value and $I_{max}$ a correspondingly larger value. An advantage of this third method of limiting in-line power dissipation is that the power rating of the LED string does not need to be predetermined. To facilitate the method, the LED string conforms to a predetermined range specification for turn-on threshold voltage.

In all methodologies used to measure in-line power dissipation, the power would be interrupted to the LED string if a predetermined limit is exceeded by the source controller 11 acting to open the disconnect switch ($S_1$) 3, as shown in FIG. 5, interrupting power to the transmission lines.

A beneficial aspect of the configuration of FIG. 5, where capacitor ($C_3$) 5 of FIG. 3 is removed, is that a cross-line fault that is within the internal circuitry of the LED string, rather than only on the transmission lines can be detected as a normal part of packet energy transfer. This capability is further illustrated by referring to FIG. 4. The period between points 38 and 40 is the slow decay region, where the transmission-line voltage has fallen below the threshold voltage of the LED string. Referring to FIG. 5, if a fault resistance is introduced via resistor ($R_5$) 32 within the circuitry of the string, the predetermined expected threshold voltage will be lowered; as signified by the action of resistor ($R_5$) 32 bypassing a number of LEDs within the string. The change is detectable by the source controller 11 of FIG. 5, which will act to open switch ($S_1$) 3, thus interrupting power to the transmission lines.

The described apparatus and methods are compatible with methods of placing multiple receivers in parallel on one transmission line. This would allow multiple LED light strings to share one transmission line, reducing the cost of the transmission system. The methodology was further described in U.S. Pub. Pat Application No. 2017/0214236 A1 by Eaves.

Figure 6:
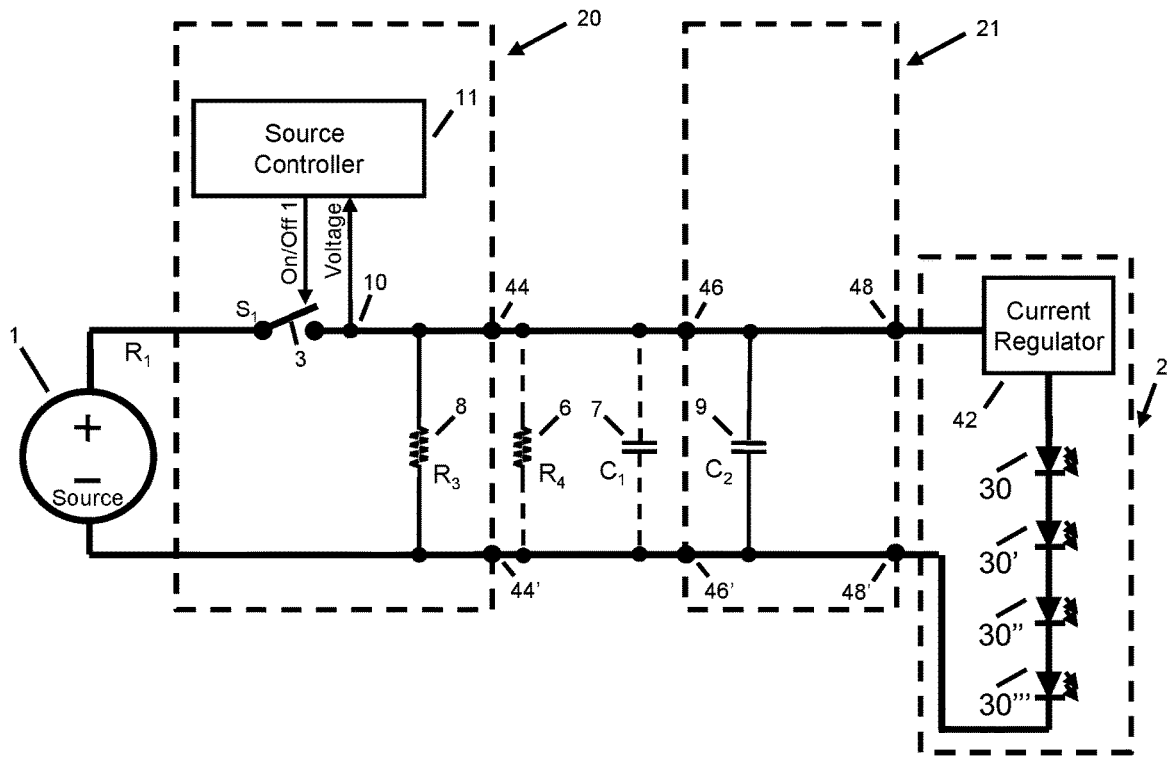
FIG. 6 is a diagram of a power distribution system where the load is a series-connected LED string equipped with a series current regulator.

LEDs are known by those in the industry to have a negative temperature coefficient for their forward voltage. This negative temperature coefficient has the effect of causing a warmer string of LEDs to draw more electrical current than a cooler string with which it is connected in parallel. The higher current causes the warmer string to reach even higher temperatures; thereby drawing even higher current, etc. Referring to FIG. 6, load 2 now comprises series LED string 30, 30', 30", 30''' along with a series current regulator 42. Current regulators are well known to those skilled in the art of power electronics and are available in linear and active switching versions from a variety of manufacturers. The current regulator maintains a constant LED current over a range of input voltages. Multiple LED strings, equipped with current regulators, can be placed in parallel at the output of the receiver 21; and the LED strings will maintain a proper predetermined LED current. Alternatively, multiple receivers, each serving an LED string with a current regulator, can be placed in parallel on a common PET transmission line, and they will maintain a proper predetermined LED current.

Although the primary example of a non-linear load described in this specification is an LED array, there are other possible applications. For example, an electrical heating element can be constructed from a series array of diodes. The diodes create heat when an electrical current is passed through them in a forward biased direction. One use for the heating element is in a hair dryer. The hair dryer would be electrically safe even when immersed in water because of the system's ability to detect an electrical fault both in the transmission lines supplying the hair dryer or anywhere inside the hair dryer.

Additional Exemplifications for Automation

The source controller 11 can include a logic device, such as a microprocessor, microcontroller, programmable logic device or other suitable digital circuitry for executing the control algorithms. The controller 11 can be a computing device and the systems and methods of this disclosure can be implemented in a computing system environment. Examples of well-known computing system environments and components thereof that may be suitable for use with the systems and methods include, but are not limited to, personal computers, server computers, hand-held or laptop devices, tablet devices, smart phones, multiprocessor systems, microprocessor-based systems, set top boxes, programmable consumer electronics, network PCs, minicomputers, mainframe computers, distributed computing environments that include any of the above systems or devices, and the like. Typical computing system environments and their operations and components are described in many existing patents (e.g., U.S. Pat. No. 7,191,467, owned by Microsoft Corp.).

The methods may be carried out via non-transitory computer-executable instructions, such as program modules. Generally, program modules include routines, programs, objects, components, data structures, and so forth, that perform particular tasks or implement particular types of data. The methods may also be practiced in distributed computing environments where tasks are performed by remote processing devices that are linked through a communications network. In a distributed computing environment, program modules may be located in both local and remote computer storage media including memory storage devices.

The processes and functions described herein can be non-transitorially stored in the form of software instructions in the computer. Components of the computer may include, but are not limited to, a computer processor, a computer storage medium serving as memory, and a system bus that couples various system components including the memory to the computer processor. The system bus can be of any of several types of bus structures including a memory bus or memory controller, a peripheral bus, and a local bus using any of a variety of bus architectures.

The computer typically includes one or more a variety of computer-readable media accessible by the processor and including both volatile and nonvolatile media and removable and non-removable media. By way of example, computer-readable media can comprise computer-storage media and communication media.

The computer storage media can store the software and data in a non-transitory state and includes both volatile and nonvolatile, removable and non-removable media implemented in any method or technology for storage of software and data, such as computer-readable instructions, data structures, program modules or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that can be used to store the desired information and that can accessed and executed by the processor.

The memory includes computer-storage media in the form of volatile and/or nonvolatile memory such as read only memory (ROM) and random access memory (RAM). A basic input/output system (BIOS), containing the basic routines that help to transfer information between elements within the computer, such as during start-up, is typically stored in the ROM. The RAM typically contains data and/or program modules that are immediately accessible to and/or presently being operated on by the processor.

The computer may also include other removable/non-removable, volatile/nonvolatile computer-storage media, such as (a) a hard disk drive that reads from or writes to non-removable, nonvolatile magnetic media; (b) a magnetic disk drive that reads from or writes to a removable, nonvolatile magnetic disk; and (c) an optical disk drive that reads from or writes to a removable, nonvolatile optical disk such as a CD ROM or other optical medium. The computer-storage medium can be coupled with the system bus by a communication interface, wherein the interface can include, e.g., electrically conductive wires and/or fiber-optic pathways for transmitting digital or optical signals between components. Other removable/non-removable, volatile/nonvolatile computer storage media that can be used in the exemplary operating environment include magnetic tape cassettes, flash memory cards, digital versatile disks, digital video tape, solid state RAM, solid state ROM, and the like.

The drives and their associated computer-storage media provide storage of computer-readable instructions, data structures, program modules and other data for the computer. For example, a hard disk drive inside or external to the computer can store an operating system, application programs, and program data.

Thus, the scope of the disclosed invention should be determined by the appended claims and their legal equivalents, rather than the examples given. In describing embodiments of the invention, specific terminology is used for the sake of clarity. For the purpose of description, specific terms are intended to at least include technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Moreover, while this invention has been shown and described with references to particular embodiments thereof, those skilled in the art will understand that various substitutions and alterations in form and details may be made therein without departing from the scope of the invention. Further still, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments. Still further, the components, steps and features identified in the Background section are integral to this disclosure and can be used in conjunction with or substituted for components and steps described elsewhere in the disclosure within the scope of the invention. In method claims, where stages are recited in a particular order—with or without sequenced prefacing characters added for ease of reference—the stages are not to be interpreted as being temporally limited to the order in which they are recited unless otherwise specified or implied by the terms and phrasing.

We claim:

1. A digital power distribution system for regulating transfer of energy via transmission lines from a source side including a power source and a transmitter including source terminals electrically coupled with the power source to a load side, the power distribution system comprising:
a) a source sensor configured to provide feedback that includes at least a signal indicative of voltage across the source terminals;
b) a transmitter including a source disconnect switch configured to stop current flow from the source through the transmission lines;
C) a receiver on the load side, wherein the receiver includes source-side terminals and load-side terminals;
d) a non-linear load, wherein the non-linear load is on the load side and is electrically coupled with the load-side terminals of the receiver to draw electrical current from the load-side terminals, wherein the non-linear load is configured such that the electrical current that the non-linear load draws from the load-side terminals drops by at least an order of magnitude when an applied voltage drops below a non-zero voltage threshold during a sample period in which supply of power from the source-side terminals of the receiver to the non-linear load is interrupted, wherein the load-side terminals of the receiver are positioned along an electrical current path between the source-side terminals of the receiver and the non-linear load, and wherein, if at least one capacitor is included in the receiver and electrically connected at connection points with the transmission lines, the load-side terminals are positioned at a location in a range from the closest connection points of the at least one capacitor to the non-linear load, and wherein, along the electrical current path between the transmitter and the non-linear load, the digital power distribution system is without a disconnect switch, including without a diode, configured to block a reversed flow of electrical current from the load-side terminals of the receiver to the transmitter when the source disconnect switch is open to thereby maintain the non-linear load in electrical contact with the load-side terminals during the sample period;
e) a source controller in the transmitter on the source side of the power distribution system configured to receive the feedback from the source sensor and to respond to the feedback and configured to periodically generate control signals; and
f) capacitance between the transmitter and the non-linear load, wherein the capacitance is configured for storing charge and discharging that charge to the non-linear load during a sample period,
wherein the source disconnect switch is responsive to the control signals from the source controller, and wherein the source controller is configured to periodically interrupt the supply of power to the non-linear load by opening the source disconnect switch to start the sample period via at least one of the control signals, enabling measurement of at least the source terminal during the interruption, and wherein the source controller is configured to close the source disconnect switch at the end of the sample period via at least one of the other control signals, and
wherein a logic device is implemented in at least the source controller and is configured to:
generate the control signal to open the source disconnect switch to start the sample period;
perform the at least one source-terminal voltage measurement when the source disconnect switch is opened, wherein the source-terminal voltage measurement is representative of impedance between the source terminals and a corresponding discharge rate of capacitance between the source terminals;
determine if the source-terminal voltage measurement indicates a rate of transmission-line voltage decay that falls outside of predetermined high and low limits, wherein the rate of transmission-line voltage decay being outside of the predetermined high and low limits indicates a possibility of a foreign object or individual making contact with at least one of the source terminals and the source-side terminals of the receiver and the transmission lines or a failure in the digital power distribution system; and
generate the control signal to close the source disconnect switch at the end of the sample period if the rate of transmission-line voltage decay falls within the predetermined high and low limits.

2. The digital power distribution system of claim 1, wherein the source controller is configured to vary the time that the source disconnect switch is open in ratio to the time that it is closed such that the power from the power source to the non-linear load is varied.

3. The digital power distribution system of claim 1, wherein the non-linear load is equipped with a current regulator to allow regulation of electrical current through the non-linear load under parallel operation or with varying transmission line voltage.

4. The digital power distribution system of claim 1, wherein the non-linear load is configured to have a forward voltage indicative of the temperature of load components, thereby enabling estimation of conditions that may be thermally damaging to the load and to adjust source current to optimize load life or performance.

5. The digital power distribution system of claim 1, wherein the non-linear load comprises a diode array.

6. The digital power distribution system of claim 5, wherein the diode array is a string of diodes connected in series, and wherein the determination as to whether the rate of transmission-line voltage decay is outside of the predetermined high and low limits includes determining whether a fault resistance exists within the string of diodes.

7. A method for regulating transfer of energy via transmission lines from a power source on a source side of a digital power distribution system, the source side including a power source and a transmitter including source terminals, to a load side of the digital power distribution system, the load side including a receiver including source-side terminals and load-side terminals, the method comprising:
measuring a voltage across the source terminals on the source side and generating feedback at least a signal indicative of the voltage using a source sensor;
receiving the feedback at a source controller in the transmitter, and using a logic device in at least the source controller to generate and communicate a control signal in response to the feedback;
supplying electrical current from the power source along an electrical current path through the transmitter and receiver to the non-linear load on the load side, wherein the electric current drawn by the non-linear load decreases by at least an order of magnitude when the applied voltage drops below a non-zero voltage threshold during a sample period;

storing a charge using capacitance;

in response to the control signal, using a source disconnect switch in the transmitter to periodically interrupt the supply of power to the non-linear load by opening the source disconnect switch to start the sample period and discharging the stored charge from the capacitance to produce the at-least-an-order-of-magnitude-lower electrical current provided to the non-linear load, and measuring the source-terminal voltage during the interruption, wherein the source-terminal voltage measurement is representative of impedance between the source terminals and a corresponding discharge rate of capacitance between the source terminals;

maintaining the non-linear load in electrical contact with the load-side terminals during the sample period, wherein, along the electrical current path between the transmitter and the non-linear load, the digital power distribution system is without a disconnect switch, including without a diode, configured to block a reversed flow of electrical current from the load-side terminals of the receiver to the transmitter when the source disconnect switch is open, wherein the load-side terminals of the receiver are positioned along the electrical current path between the source-side terminals of the receiver and the non-linear load, and wherein, if at least one capacitor is included in the receiver and electrically connected at connection points with the transmission lines, the load-side terminals are positioned at a location in a range from the closest connection points of the at least one capacitor to the non-linear load;

determining if the source-terminal voltage measurement indicates a rate of transmission-line voltage decay that falls outside of predetermined high and low limits, wherein the rate of transmission-line voltage decay being outside of the predetermined high and low limits indicates a possibility of a foreign object or individual making contact with at least one of the source terminals and the source-side terminals of the receiver and the transmission lines or a failure in the digital power distribution system; and closing the source disconnect switch at the end of the sample period if the rate of transmission-line voltage decay falls within the predetermined high and low limits.

8. The method of claim 7, further comprising using the source controller to vary the time that the source disconnect switch is open in ratio to the time that it is closed to vary the power from the power source to the non-linear load.

9. The method of claim 7, wherein the non-linear load is equipped with a current regulator, the method further comprising using the current regulator to regulate electrical current through the non-linear load under parallel operation or with varying transmission line voltage.

10. The method of claim 7, wherein the non-linear load is configured to have a forward voltage indicative of the temperature of load components, the method further comprising estimating conditions that may be thermally damaging to the load and adjusting source current to optimize load life or performance.

11. The method of claim 7, wherein the non-linear load comprises a diode array.

12. The method of claim 11, wherein the diode array is a string of diodes connected in series, and wherein the determination as to whether the rate of transmission-line voltage decay is outside of the predetermined high and low limits includes determining whether a fault resistance exists within the string of diodes.

* * * * *

UNITED STATES PATENT AND TRADEMARK OFFICE
CERTIFICATE OF CORRECTION

| | |
|---|---|
| PATENT NO. | : 11,831,144 B2 |
| APPLICATION NO. | : 17/688447 |
| DATED | : November 28, 2023 |
| INVENTOR(S) | : Stephen Spencer Eaves and Stanley Mlyniec |

Page 1 of 1

It is certified that error appears in the above-identified patent and that said Letters Patent is hereby corrected as shown below:

In the Claims

Column 11, Line 18, In Claim 1, insert --power-- before "source" in the second line of subpart (b);

Column 11, Line 20, In Claim 1, replace "C" with --c-- as the identifier for the third subpart (subpart c);

Column 11, Line 65, In Claim 1, in the seventh line of the "wherein" clause following subpart (f), replace "the source terminal" with --one source-terminal voltage--.

Column 12, Line 59, In Claim 7, in the second line of the first recited step, insert --including-- between "feedback" and "at least".

Signed and Sealed this
Twenty-seventh Day of February, 2024

Katherine Kelly Vidal
*Director of the United States Patent and Trademark Office*